(12) United States Patent
De Angeli

(10) Patent No.: US 11,022,580 B1
(45) Date of Patent: Jun. 1, 2021

(54) LOW IMPEDANCE STRUCTURE FOR PCB BASED ELECTRODES

(71) Applicant: Flex Ltd., Singapore (SG)

(72) Inventor: Marco De Angeli, Brazana (IT)

(73) Assignee: Flex Ltd., Singapore (SG)

( * ) Notice: Subject to any disclaimer, the term of this patent is extended or adjusted under 35 U.S.C. 154(b) by 212 days.

(21) Appl. No.: 16/263,350

(22) Filed: Jan. 31, 2019

(51) Int. Cl.
*G01N 27/416* (2006.01)
*H05K 1/18* (2006.01)
*G01N 27/30* (2006.01)

(52) U.S. Cl.
CPC ....... *G01N 27/4167* (2013.01); *G01N 27/302* (2013.01); *H05K 1/181* (2013.01)

(58) Field of Classification Search
CPC .................................................. G01N 27/4167
See application file for complete search history.

(56) References Cited

U.S. PATENT DOCUMENTS

| | | | |
|---|---|---|---|
| 3,830,991 A | 8/1974 | Durocher | |
| 4,017,697 A | 4/1977 | Larson | |
| 5,626,135 A | 5/1997 | Sanfilippo | |
| 6,388,556 B1 | 5/2002 | Imai | |
| 6,400,573 B1 | 6/2002 | Mowatt | |
| 6,483,055 B1 | 11/2002 | Tanobe | |
| 6,830,668 B2 * | 12/2004 | Musho | G01N 27/307 204/400 |
| 7,112,755 B2 | 9/2006 | Kitano | |
| 7,528,337 B2 | 5/2009 | Tanobe | |
| 7,935,893 B2 | 5/2011 | Tanaka | |
| 8,552,730 B2 * | 10/2013 | Chiao | C23C 28/345 324/438 |
| 9,549,468 B1 | 1/2017 | Tsai et al. | |
| 9,651,514 B2 * | 5/2017 | Soccol | G01N 27/4167 |
| 2004/0000425 A1 | 1/2004 | White | |
| 2006/0131158 A1 | 6/2006 | Takiguchi | |
| 2006/0131440 A1 | 6/2006 | Yen | |
| 2006/0132427 A1 | 6/2006 | Weisberg | |
| 2007/0077682 A1 | 4/2007 | Cerio | |

(Continued)

OTHER PUBLICATIONS

Understanding the Influence of Copper Nanoparticles on Thermal Characteristics and Microstructural Dvelopment of a Tin-Silver Soldier, D.C. Lin, T.S. Srivatsan, G-X Wang, and R. Kovacevic (Submitted Jan. 12, 20006, in revised form Oct. 10, 2006).

(Continued)

*Primary Examiner* — Luan V Van
*Assistant Examiner* — Caitlyn Mingyun Sun
(74) *Attorney, Agent, or Firm* — Haverstock & Owens LLP

(57) ABSTRACT

A PCB based electrochemical sensor includes a PCB having a first electrode on a first surface of the PCB, and a second electrode on a second surface. A sensing element, such as a conductive wire, is attached to the first electrode. The PCB includes one or more through holes, and the conductive wire is positioned proximate one or more of the one or more through holes. When the PCB based electrochemical sensor is positioned in a solution to be sensed, the solution fills the through holes. The ions within the solution provide a current pathway between the conductive wire and the second electrode through the through holes. A voltage potential between the two electrodes is measured. The measured voltage potential is used to determine a value associated with the solution, such as a pH value.

19 Claims, 3 Drawing Sheets

(56) References Cited

U.S. PATENT DOCUMENTS

| | | |
|---|---|---|
| 2007/0221404 A1 | 9/2007 | Das |
| 2008/0054443 A1 | 3/2008 | Shih |
| 2009/0083975 A1 | 4/2009 | Lee |
| 2009/0301606 A1 | 12/2009 | Ueshima |
| 2010/0000762 A1 | 1/2010 | Yang |
| 2010/0160762 A1 | 1/2010 | McLaughlin |
| 2010/0063365 A1 | 3/2010 | Pisani |
| 2010/0107770 A1 | 5/2010 | Serban |
| 2010/0185076 A1 | 7/2010 | Jeong |
| 2011/0225816 A1 | 9/2011 | Chou |
| 2011/0290540 A1 | 12/2011 | Jung |
| 2013/0019383 A1 | 1/2013 | Korkala |
| 2013/0060115 A1 | 3/2013 | Gehman |
| 2013/0074331 A1 | 3/2013 | Brun |
| 2013/0209672 A1 | 8/2013 | Reinmuth |
| 2014/0015633 A1 | 1/2014 | Nakae |
| 2014/0343390 A1 | 11/2014 | Berzowska |
| 2015/0366504 A1 | 12/2015 | Connor |
| 2016/0013152 A1 | 1/2016 | Yu et al. |
| 2017/0172421 A1 | 6/2017 | Dabby |
| 2017/0315657 A1 | 11/2017 | Lai |
| 2018/0180574 A1* | 6/2018 | Paul .................. G01N 27/40 |
| 2019/0234814 A1 | 8/2019 | Yoon |

OTHER PUBLICATIONS

A Reliability Study of Nanoparticles Reinforced Composite Lead-Free Solder, Si Chen1m Lill Zhang1, Johan Liu1 (received Dec. 7, 2009; Accepted May 19, 2010, Published Sep. 25, 2010).

Recent Development of Nano-solder Paste for Electronics Interconnect Applications; Johan Liu, Christina Andersson, Yuali Gao and Qijie Zhai, 2008 10th Electronics Packaging Technology Conference.

* cited by examiner

LOW IMPEDANCE STRUCTURE FOR PCB BASED ELECTRODES

FIELD OF THE INVENTION

The present invention is generally directed to sensing circuits. More specifically, the present invention is directed to a PCB based electrochemical sensor having a low impedance structure between electrodes.

BACKGROUND OF THE INVENTION

An electrochemical sensor may be used to determine the analytical concentration of some component(s) of an analyte solution. Electrochemical sensors are often used for analytical measurements, for example the measurement of chemical and physical properties of liquids. Typical measured parameters include pH value, conductivity, oxygen, and the like. The electrochemical sensor can be configured to measure the electrical potential between two electrodes connected to an electric circuit. The solution into which the two electrodes are placed provides an electrical pathway between the two electrodes and a means for closing the circuit. In some applications, electrochemical sensors are made using a printed circuit board. A first electrode is positioned on a first side, for example a front side, of the printed circuit board, and a second electrode is positioned on a second side, for example a back side, of the printed circuit board. The two electrodes are connected to respective conductive interconnects on the printed circuit board, which are routed to measurement circuitry either on or off the printed circuit board. The printed circuit board, including at least a portion of each of the first and second electrodes is placed in solution, and the two electrodes on either side of the printed circuit board are electrically interconnected by the solution surrounding the printed circuit board. The impedance of the current pathway through the solution is determined by the distance between the two electrodes around the perimeter of the printed circuit board. In other words, the current pathway through the solution extends from the first electrode along the first surface of the printed circuit board, loops around the edge of the printed circuit board, and along the second surface to the second electrode. The greater the distance of this current pathway, the greater the impedance. It is a design objective to minimize this impedance.

SUMMARY OF THE INVENTION

The PCB based electrochemical sensor includes a PCB having a first surface and a second surface on an opposite side of the PCB as the first surface. It is understood that the term PCB can be used to generally apply to any type of conventional circuit board. The PCB can be a rigid or flexible circuit board having a single layer or multiple layers. Even more generally, the PCB is representative of an insulating substrate, which can be rigid or flexible. A first electrode is formed on or attached to the first surface of the PCB, and a second electrode is formed on or attached to the second surface. The first electrode and the second electrode are each made of electrically conductive material, and can be formed as patterned conductive interconnects on the first and second surfaces of the PCB or made as separate discrete components and attached to the first and second surfaces. In some embodiments, the first electrode and the second electrode are made of copper. In some embodiments, the first electrode and the second electrode are additionally treated, such as gold finished or plated to prevent corrosion. A voltage potential between the two electrodes is measured. When the PCB based electrochemical sensor is placed in a solution to be sensed, the measured voltage potential is used to determine a value associated with the solution, such as a pH value. As such, the first electrode and the second electrode are connected to additional electronic circuitry configured to measure the voltage potential. Some or all of this additional electronic circuitry can be off-PCB or on-PCB. In some embodiments, the additional electronic circuitry includes a potentiometer. The potentiometer can be mounted to the PCB or the potentiometer can be separate from the PCB, the potentiometer and the PCB electrically connected to each other via electrical wiring or other conventional means for providing electrical interconnection.

The first electrode and the second electrode form a portion of the electrical circuit used in the PCB based electrochemical sensor. A sensing element is attached to one of the electrodes, for example the first electrode. The sensing element is an electrically conductive material, and the type of material(s) used for the sensing element is application specific. In an exemplary application, the PCB based electrochemical sensor is a pH sensor. In this case, the sensing element can be made of silver chloride, which is a well know material used in pH sensing. It is understood that alternative materials can be used for the sensing element depending on the type of sensing to be performed. Other examples can include the use of a Rhodium coated wire, a gold coated wire, or other combinations of wire and coating depending on a specific chemical to be sensed. In general, the PCB based electrochemical sensor includes a sensing element complementary to a specific chemical reduction/oxidation where ion concentration or free electrons are resulting in a voltage difference or a net current that can be measured. In some embodiments, the sensing element is formed as a conductive wire attached to the first electrode. The PCB includes one or more through holes, and the conductive wire is positioned proximate one or more of the one or more through holes. When the PCB based electrochemical sensor is positioned in solution, the solution fills the through holes. Ions in the solution provide a current pathway between the conductive wire and the second electrode through the through holes.

In an aspect, an electrochemical sensor positioned in an solution is disclosed. The electrochemical sensor includes an insulating substrate, a first electrode, a second electrode, and a conductive wire. The insulating substrate has a first surface and a second surface, wherein the insulating substrate comprises one or more through holes. The first electrode is coupled to the first surface of the insulating substrate. The second electrode is coupled to the second surface of the insulating substrate. The conductive wire is attached to the first electrode, wherein the conductive wire is positioned proximate the one or more through holes in the insulating substrate. A current pathway is formed by the solution from the conductive wire, through the one or more through holes, and to the second electrode. In some embodiments, the insulating substrate comprises a circuit board. In some embodiments, the circuit board comprises a printed circuit board. In some embodiments, the circuit board comprises a flexible circuit board. In some embodiments, the conductive wire and the second electrode form a sensing element. In some embodiments, a surface of the conductive wire is an active surface of the sensing element. In some embodiments, an impedance of the current pathway is a function of the distance from the conductive wire to the second electrode through the one or more through holes of the insulating material. In some embodiments, the electrochemical sensor further comprises electronic circuitry coupled to the first electrode and the second electrode, wherein the electronic circuitry is configured to measure a voltage potential between the first electrode and the second electrode. In some embodiments, the first electrode comprises a first electrode through hole, and the first electrode is positioned on the first surface of the insulating substrate such that the first electrode through hole is aligned with the one or more holes of the insulating substrate. In some embodiments, the second electrode comprises one or more second electrode through holes, and the second electrode is positioned on the second surface of the insulating substrate such that each second electrode through hole is aligned with a corresponding one through hole of the insulating material. In some embodiments, a size and shape of each of the one or more second electrode through holes is the same as a size and shape of each of the one or more through holes of the insulating substrate. In some embodiments, at least a portion of the conductive wire is aligned over at least one of the one or more through holes of the insulating substrate. In some embodiments, the conductive wire is made of silver. In some embodiments, the conductive wire is made of silver coated with silver chloride. In some embodiments, the first electrode and the second electrode each comprise copper. In some embodiments, the first electrode and the second electrode each comprise gold plated copper or iridium oxide coated copper. In some embodiments, the electrochemical sensor further comprises a second conductive wire attached to the second electrode, and the current pathway is formed by the solution from the conductive wire, through the one or more through holes, and to the second conductive wire.

BRIEF DESCRIPTION OF THE DRAWINGS

Several example embodiments are described with reference to the drawings, wherein like components are provided with like reference numerals. The example embodiments are intended to illustrate, but not to limit, the invention. The drawings include the following figures.

DETAILED DESCRIPTION OF THE EMBODIMENTS

Embodiments of the present application are directed to a PCB based electrochemical sensor. Those of ordinary skill in the art will realize that the following detailed description of the PCB based electrochemical sensor is illustrative only and is not intended to be in any way limiting. Other embodiments of the PCB based electrochemical sensor will readily suggest themselves to such skilled persons having the benefit of this disclosure.

Reference will now be made in detail to implementations of the PCB based electrochemical sensor as illustrated in the accompanying drawings. The same reference indicators will be used throughout the drawings and the following detailed description to refer to the same or like parts. In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Figure 1:
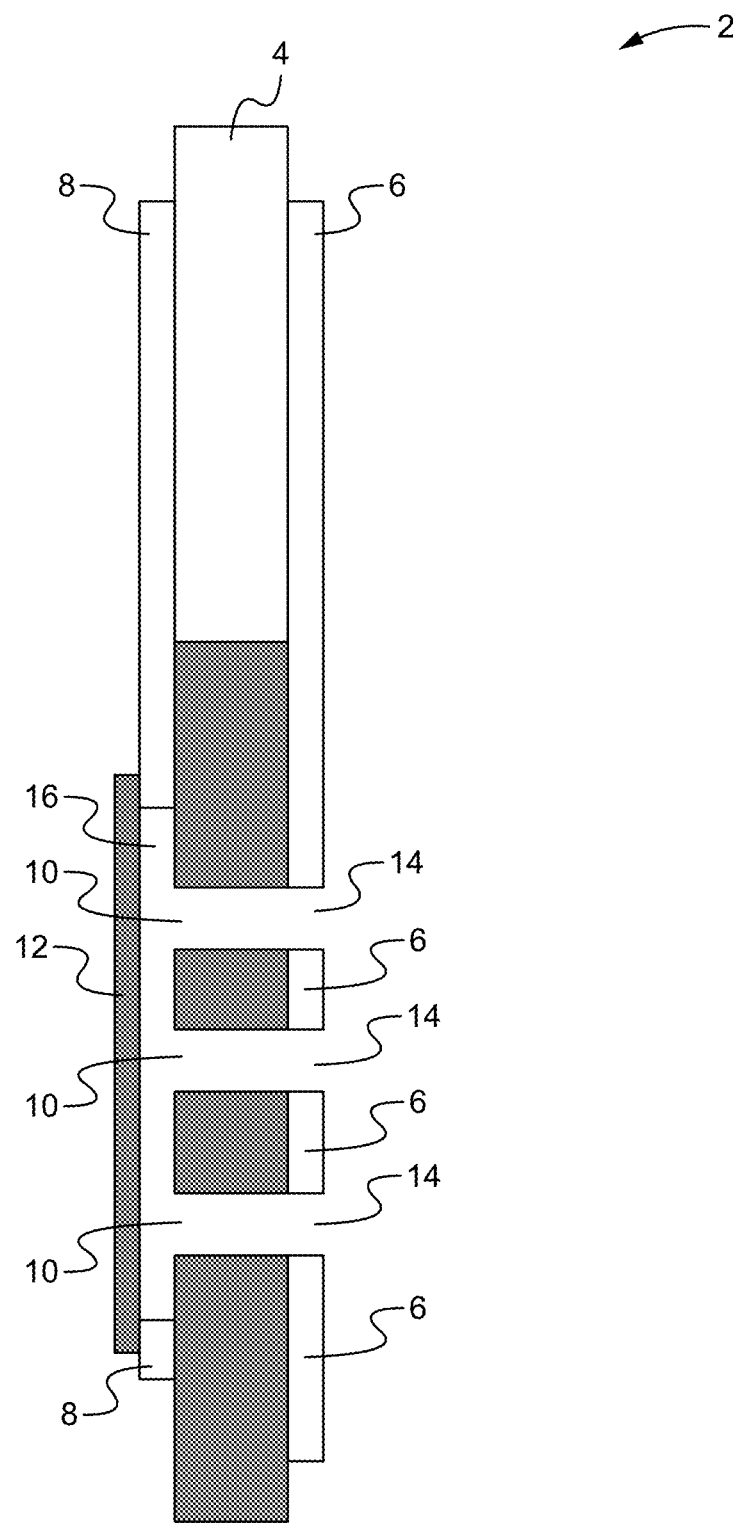
FIG. 1 illustrates a cut out side view of a PCB based electrochemical sensor according to some embodiments.
Figure 2:
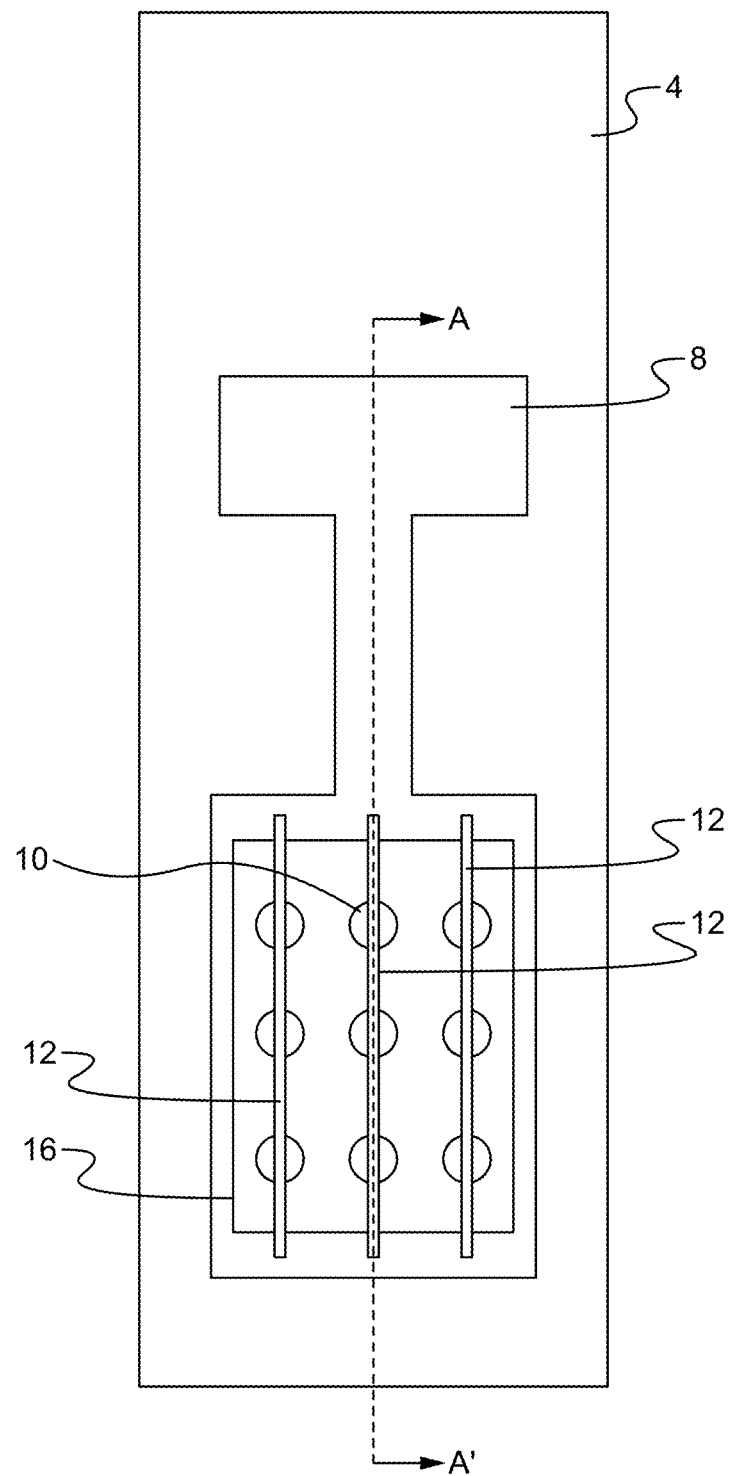
FIG. 2 illustrates a top down view of the PCB based electrochemical sensor of FIG. 1.
Figure 3:
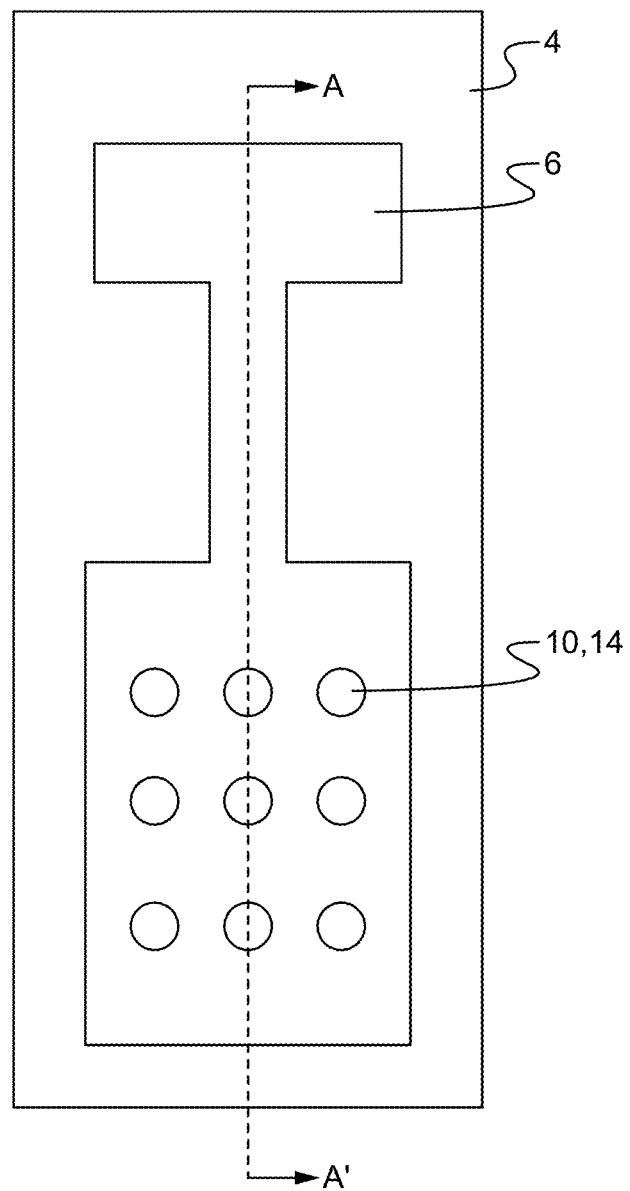
FIG. 3 illustrates a bottom up view of the PCB based electrochemical sensor of FIG. 1.

FIG. 1 illustrates a cut out side view of a PCB based electrochemical sensor according to some embodiments. FIG. 2 illustrates a top down view of the PCB based electrochemical sensor of FIG. 1. FIG. 3 illustrates a bottom up view of the PCB based electrochemical sensor of FIG. 1. The cut out side view shown in FIG. 1 is taken along the line A-A' shown in FIGS. 2 and 3. The PCB based electrochemical sensor 2 includes a PCB 4, a first electrode 8, a second electrode 6, and a conductive wire 12. It is understood that although element 4 is referred to as a PCB, element 4 can be any type of conventional circuit board including, but not limited to, a flexible circuit board or a rigid circuit board. One or more through holes 10 are formed in the PCB 4. In the exemplary configuration shown in FIGS. 1-3, a 3×3 array of through holes 10 are formed through the PCB 4. It is understood that more or less than nine through holes can be formed through the PCB. It is also understood that the through holes can be alternatively arranged than the 3×3 array.

The first electrode 8 is formed on one surface of the PCB 4, and the second electrode 6 is formed on another surface of the PCB 4. In the exemplary configuration shown in FIGS. 1-3, the PCB is shown to only have the first electrode and the second electrode. It is understood that the PCB can have additional electronic circuitry formed on the first and second surfaces, as well as conductive interconnects through the PCB, such as plated through hole vias and plated vias that interconnect conductive interconnects on one or more layers of the PCB. It is also understood that one or more discrete electronic components can be mounted to the first surface and/or the second surface of the PCB and electrically interconnected according to the desired design. Examples of such mounted components include, but are not limited to, resistors, inductors, capacitors, and semiconductor devices (die).

The electrodes 6 and 8 can be formed using an additive or subtractive process. For example, the electrodes 6 and 8 can be pattern etched or printed. The electrodes 6 and 8 can also be formed as discrete components and attached to the respective surfaces of the PCB, such as by an adhesive. The electrodes 6 and 8 are made of an electrically conductive material, such as copper. In some embodiments, the electrically conductive material is plated or finished, such as gold plated copper or iridium oxide coated copper, depending on the application. The second electrode 6 includes one or more through holes 14. In the exemplary configuration shown in FIGS. 1-3, the number of through holes 14 in the second electrode 6 is the same as the number of through holes 10 in the PCB 4, and each through hole 14 is aligned with a corresponding through hole 10. In some embodiments, such as that shown in FIGS. 1-3, a size and shape of the through holes 14 in the second electrode 6 are the same as a size and shape of the through holes 10 in the PCB 4. By having the size and shape of the through holes 14 match the size and shape of the through holes 10, the current pathway from the conductive wire 12 to the second electrode 6, through the through hole 10, is minimized. If the through holes in the second electrode are larger than the through holes of the PCB, then the through hole edges of the second electrode are recessed from the through hole edges of the PCB, which adds distance to the current pathway equal to the amount that the through hole edge of the second electrode is recessed from the through hole edge of the PCB. In other embodiments, the number of through holes in the second electrode is not the same as the number of through holes in the PCB, but there is at least an opening in the second electrode aligned with each through hole in the PCB so that the second electrode does not block the through holes in the PCB. In still other embodiments, the second electrode is a planar sheet with no through holes In this example, the solution stills provides a current pathway from the conductive wire 12 to the second electrode 6 through the through holes 10 in the PCB 4. However, in some applications, inclusion of the through holes 14 in the second electrode 6 improves the speed of the sensor because the through holes 14 in the second electrode 6 improves chemical reaction and ion mobility, facilitating the re-circulation of the solution being analyzed through the through holes.

In some embodiments, such as the configuration shown in FIG. 2, the first electrode 8 includes an opening 16 that exposes the through holes 10 of the PCB 4. As shown in FIG. 2, a single opening is formed in the first electrode 8. Alternatively, multiple openings can be formed in the first electrode so as to expose the through holes 10 in the PCB 4. One or more conductive wires 12 are attached to the first electrode 8, thereby forming an electrical interconnection between the two. In the exemplary configuration shown in FIG. 2, there are three conductive wires 12. It is understood that more or less than three conductive wires can be used. The number of conductive wires, and the dimensions, such as thickness and length, of each conductive wire is selected to achieve a desired impedance. In some embodiments, each end of each conductive wire 12 is attached to the first electrode 8. It is understood that each conductive wire can be attached to the first electrode at non-end positions of the conductive wire. In some embodiments, each conductive wire 12 is attached to the first electrode 8 using wire bonding. Wire bonding provides the benefit of not using solder paste, which introduces contaminates, to attach each conductive wire to the first electrode. Wire bonding essentially uses heat to melt the conductive wire onto the first electrode. It is understood that alternative attachment means can be used to mechanically and electrically connect each conductive wire to the first electrode. Examples of such attachment means include, but are not limited to, conductive adhesive, solder paste, current heating, or laser melting. In some embodiments, the first electrode includes bonding pads for bonding the conductive wires to the first electrode. In some embodiments, the first electrode 8 can be covered by an isolating material. Examples of such isolating material include, but are not limited to, glue epoxy, paint, plastic, and PVD (Polyvinylidene Fluoride). The isolating material can be used in those applications where the first electrode is not to touch the solution so as to avoid a different generated voltage. In this case, only the conductive wires, left uncoated over the opening 16, interact with the solution.

Element 12 is described above and shown in FIGS. 1-3 as a conductive wire. In other embodiments, the element 12 can be alternatively configured and shaped, such as a conductive strip.

The first electrode 8 and the second electrode 6 form a portion of an electrical circuit used in the PCB electrochemical sensor 2. In some embodiments, the electrical circuit includes a potentiometer (not shown). The potentiometer can be mounted to the PCB 4 or the potentiometer can be separate from the PCB 4, the potentiometer and the PCB 4 electrically connected to each other via electrical wiring or other conventional means for providing electrical interconnection. The conductive wires 12 function as a sensing element. The sensing element is an electrically conductive material, and the type of material(s) used for the sensing element is application specific. In an exemplary application, the PCB based electrochemical sensor 2 is a pH sensor. In this case, the sensing element can be made of silver chloride. It is understood that alternative materials can be used for the sensing element depending on the type of sensing to be performed. A surface of each conductive wire 12 is an active surface of the sensing element.

In operation the PCB based electrochemical sensor 2 is placed in a solution to be sensed such that the conductive wires 12, at least the portion of the PCB 4 with the through holes 10, and at least the portion of the second electrode 6 proximate the through holes 10 are submerged in the solution. The ions in the solution provide a current pathway between the second electrode 6 and the conductive wires 12 attached to the first electrode 8, thereby closing the loop of the electrical circuit that measures the voltage potential between the two electrodes. The solution fills the through holes 10 in the PCB 4. The solution current pathway extends between the conductive wires 12 and the second electrode 6, passing through the through holes 10 in the PCB 4. The solution has sufficient ion concentration to enable the current pathway through the solution. The impedance of this "current" pathway is a function of the distance between the conductive wires 12 and the second electrode 6 through the through holes 10 in the PCB 4. The greater the distance between the conductive wires 12 and the second electrode 6 through the through holes 10, the greater the impedance of the solution current pathway. The greater this impedance, the less effective is the PCB based electrochemical sensor.

The number of through holes in the PCB is determined as a tradeoff between increasing the number of current pathways versus mechanical stability of the PCB. The greater the number of through holes and/or the larger the size of each through hole, the lower the mechanical robustness of the PCB. Additionally, the larger the number/size of the through holes, the greater the corresponding number/size of holes in the second electrode, which reduces the surface area of the second electrode. The lower the surface area of the second electrode, the less effective is the current pathway formed by the solution. In some embodiments, a ratio of an area of the holes in the second electrode to a surface area of the second electrode is about 1:1.

In the exemplary configuration shown in FIGS. 1-3, there are multiple through holes 10 of the PCB 4 aligned with each conductive wire 12. Alternatively, a single larger through hole can be formed under the length of each conductive wire, such as a single rectangular hole positioned under each conductive wire 12. However, with larger through holes comes decreased mechanical stability of the PCB. In general, the PCB can have a single through hole, and this can be extended to any number of through holes depending on the application and corresponding design parameters.

In some embodiments, the PCB based electrochemical sensor is configured for pH sensing. In this case, the conductive wires 12 can be made of silver chloride coated silver wires, which are known to be effective for pH sensing, and the second electrode 6 can be made of copper or gold plated copper. The conductive wires 12, and by extension the first electrode 8, function as a reference electrode, and the second electrode 6 functions as a working electrode. The silver chloride coated silver wires 12 functions as the sensing element. A voltage potential between the conductive wires 12, via the first electrode 8, and the second electrode 6 is measured. The measured voltage potential is converted to a corresponding pH level of the solution.

In some embodiments, other conductive wires are attached to the second electrode. The other conductive wires can be made of the same material(s) as the second electrode, such as copper with gold finish or plating. The other conductive wires can be aligned over the through holes in the PCB. The other conductive wires can be aligned with the conductive wires attached to the first electrode. The other conductive wires can be attached to a second electrode having similar configuration as the second electrode described above (FIGS. 1 and 3), for example an electrode having holes that correspond to the through holes in the PCB. Alternatively, the second electrode can be configured more similarly to the first electrode described above (FIG. 2) with a single large opening, or multiple large openings that are larger than the individual though holes in the PCB.

The present application has been described in terms of specific embodiments incorporating details to facilitate the understanding of the principles of construction and operation of the PCB based electrochemical sensor. Many of the components shown and described in the various figures can be interchanged to achieve the results necessary, and this description should be read to encompass such interchange as well. As such, references herein to specific embodiments and details thereof are not intended to limit the scope of the claims appended hereto. It will be apparent to those skilled in the art that modifications can be made to the embodiments chosen for illustration without departing from the spirit and scope of the application.

What is claimed is:

1. An electrochemical sensor positioned in a solution, the electrochemical sensor comprising:
   a. an insulating substrate having a first surface and a second surface, wherein the insulating substrate comprises one or more through holes;
   b. a first electrode coupled to the first surface of the insulating substrate;
   c. a second electrode coupled to the second surface of the insulating substrate;
   d. a conductive wire attached to the first electrode, wherein the conductive wire is entirely outside of and aligned over the one or more through holes in the insulating substrate,
   wherein a current pathway is formed by the solution from the conductive wire, through the one or more through holes, and to the second electrode.

2. The electrochemical sensor of claim 1 wherein the insulating substrate comprises a circuit board.

3. The electrochemical sensor of claim 2 wherein the circuit board comprises a printed circuit board.

4. The electrochemical sensor of claim 2 wherein the circuit board comprises a flexible circuit board.

5. The electrochemical sensor of claim 1 wherein the conductive wire and the second electrode form a sensing element.

6. The electrochemical sensor of claim 5 wherein a surface of the conductive wire is an active surface of the sensing element.

7. The electrochemical sensor of claim 1 wherein an impedance of the current pathway is a function of the distance from the conductive wire to the second electrode through the one or more through holes of the insulating material.

8. The electrochemical sensor of claim 1 further comprising electronic circuitry coupled to the first electrode and the second electrode, wherein the electronic circuitry is configured to measure a voltage potential between the first electrode and the second electrode.

9. The electrochemical sensor of claim 1 wherein the first electrode comprises a first electrode through hole, and the first electrode is positioned on the first surface of the insulating substrate such that the first electrode through hole is aligned with the one or more through holes of the insulating substrate.

10. The electrochemical sensor of claim 1 wherein the second electrode comprises one or more second electrode through holes, and the second electrode is positioned on the second surface of the insulating substrate such that each second electrode through hole is aligned with a corresponding one through hole of the insulating material.

11. The electrochemical sensor of claim 10 wherein a size and shape of each of the one or more second electrode through holes is the same as a size and shape of each of the one or more through holes of the insulating substrate.

12. The electrochemical sensor of claim 1 wherein the conductive wire is made of silver.

13. The electrochemical sensor of claim 1 wherein the conductive wire is made of silver coated with silver chloride.

14. The electrochemical sensor of claim 1 wherein the first electrode and the second electrode each comprise copper.

15. The electrochemical sensor of claim 1 wherein the first electrode and the second electrode each comprise gold plated copper or iridium oxide coated copper.

16. The electrochemical sensor of claim 1 further comprising a second conductive wire attached to the second electrode, and the current pathway is formed by the solution from the conductive wire, through the one or more through holes, and to the second conductive wire.

17. The electrochemical sensor of claim 1 wherein the second electrode comprises a planar sheet with no through holes.

18. The electrochemical sensor of claim 1 wherein the conductive wire is a separate and discrete component from the first electrode.

19. The electrochemical sensor of claim 18 wherein the conductive wire is made of a different material than the first electrode.

* * * * *